United States Patent [19]

Khayat

[11] Patent Number: 5,493,235
[45] Date of Patent: Feb. 20, 1996

[54] PROGRAMMABLE AND STABLE THRESHOLD CMOS INVERTER

[75] Inventor: Joseph M. Khayat, Bedford, N.H.

[73] Assignee: Unitrode Corporation, Billerica, Mass.

[21] Appl. No.: 305,885

[22] Filed: Sep. 14, 1994

[51] Int. Cl.⁶ .............................................. H03K 19/0948
[52] U.S. Cl. ................................................. 326/34; 326/58
[58] Field of Search .................................. 326/32, 33, 34, 326/50, 71, 81, 58, 121; 327/513, 53

[56] References Cited

U.S. PATENT DOCUMENTS

| | | | |
|---|---|---|---|
| 4,042,839 | 8/1977 | Araki | 326/33 |
| 4,714,840 | 12/1987 | Proebsting | 326/341 |
| 4,808,852 | 2/1989 | Kousaka et al. | 326/71 |
| 5,045,721 | 9/1991 | Yan | 326/83 |
| 5,124,580 | 6/1992 | Matthews et al. | |
| 5,172,016 | 12/1992 | Dobberpuhl | 326/71 |

OTHER PUBLICATIONS

Klass Bult and Hans Wallinga, "A Class of Analog CMOS Circuits Based on the Square-Law Characteristic of an MOS Transistor in Saturation", IEEE Journal of Solid-State Circuits, vol. SC-22, Jun. 1987, pp. 357-365.

Primary Examiner—Edward P. Westin
Assistant Examiner—Benjamin D. Driscoll
Attorney, Agent, or Firm—Weingarten, Schurgin, Gagnebin & Hayes

[57] ABSTRACT

An inverter circuit having a readily programmable and stable threshold voltage and low propagation delay. An input stage of the inverter includes a pair of transistors, a first one adapted to receive an input signal for inversion and being disposed in a first current path and a second one being disposed in a second current path. The input stage further comprises a third transistor connected in series with the first transistor and receiving a bias voltage. The first, second, and third transistors are all of the same type; i.e., all NMOS or all PMOS. An output stage of the inverter includes a PMOS transistor and an NMOS transistor having interconnected drain terminals at which an inverted output signal is provided. The threshold voltage about which the output signal transitions is a function of the bias voltage and characteristics of the first, second, and third transistors in the input stage.

20 Claims, 4 Drawing Sheets

PROGRAMMABLE AND STABLE THRESHOLD CMOS INVERTER

FIELD OF THE INVENTION

The invention relates to the field of inverter circuits and more specifically, to CMOS inverter circuits having a programmable switching threshold.

BACKGROUND OF THE INVENTION

Figure 1:
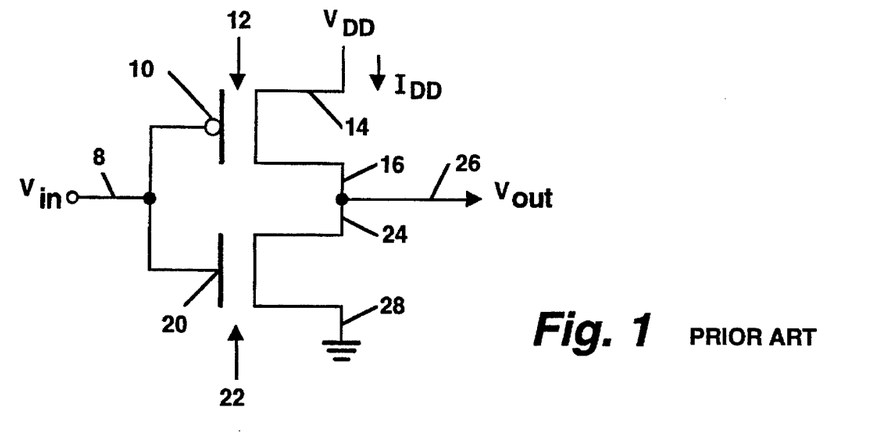
FIG. 1 is a schematic diagram of an inverter as known in the prior art.

Fast inverter circuits are required in many electronic circuit applications. A typical CMOS inverter circuit is shown in FIG. 1. In this inverter, the input signal voltage, $V_{in}$, is applied through input terminal 8 to gate terminals 10 and 20 of PMOS FET 12 and NMOS FET 22, respectively. Source terminal 14 of PMOS FET 12 is connected to supply voltage $V_{DD}$ and drain terminal 16 of PMOS FET 12 is connected both to drain terminal 24 of NMOS FET 22 and to inverter output terminal 26. Source terminal 28 of NMOS FET 22 is connected to ground.

When the input signal voltage, $V_{in}$, on input terminal 8 is at a logic low level, both gates 10 and 20 are low. As a result of these gate voltages, NMOS FET 22 is less conductive than PMOS FET 12. Output terminal 26 is thus set to a logic high level. Conversely, when the input signal voltage, $V_{in}$, on input terminal 8 is set high, both gates 10 and 20 are set high and as a result, PMOS FET 12 is less conductive than NMOS FET 22. Output terminal 26 is thus set to logic low. This inverter circuit has a low propagation delay, generally on the order of 3 to 5 nanoseconds.

It should be noted that when the input signal voltage $V_{in}$ is equal to zero, NMOS FET 22 is shut off and current $I_{DD}$ from $V_{DD}$ to ground is zero. Similarly, when $V_{in}$ is equal to $V_{DD}$, PMOS FET 12 is shut off, and current $I_{DD}$ from $V_{DD}$ to ground is again zero.

The threshold voltage, corresponding to the input signal voltage about which the inverter output signal transitions, is given by the expression:

$$V_{threshold} = \frac{V_{DD} - V_{T_P} + \sqrt{\dfrac{\left(\dfrac{W}{L}\right)_N KP_N}{\left(\dfrac{W}{L}\right)_P KP_P}} V_{T_N}}{1 + \sqrt{\dfrac{\left(\dfrac{W}{L}\right)_N KP_N}{\left(\dfrac{W}{L}\right)_P KP_P}}} \quad (1)$$

where $KP_N$ and $KP_P$ is the transconductance of the N material and P material, respectively, (defined as the mobility of the carrier times the permittivity of the oxide layer divided by the thickness of the oxide layer); $(W/L)_N$ and $(W/L)_P$ is the ratio of the effective channel width to effective channel length for the NMOS FET and PMOS FET, respectively, and $VT_{T_P}$ and $VT_{T_N}$ is the threshold voltage of the PMOS and NMOS, respectively. More particularly, when the input signal voltage $V_{in}$ satisfies equation (1) above, the drain-to-source current of the NMOS FET 22 is equal to the drain-to-source current of the PMOS FET 22 (i.e., $ID_{DS_N} = I_{DS_P}$) and NMOS FET 22 and PMOS FET 12 are in saturation.

Although this prior art inverter has the attributes of having a small size and a low propagation delay, the threshold voltage, $V_{threshold}$, about which the output signal $V_{out}$ changes state is a function of parameters $V_{DD}$, $VT_{T_P}$, $V_{T_N}$, $KP_P$ and $KP_N$ and may vary by as much as ±25% as a function of process and temperature variations.

SUMMARY OF THE INVENTION

In accordance with the invention, an inverter circuit is provided with a readily programmable and stable threshold voltage and advantageously low propagation delay. The inverter circuit includes an input stage comprising a pair of like transistors (i.e., both NMOS or PMOS), a first one being adapted to receive an input voltage for inversion and being disposed in a first current path and the second one being disposed in a second current path. An output stage includes a PMOS transistor and an NMOS transistor having interconnected drain terminals at which an inverted output signal is provided. The threshold voltage, corresponding to the input voltage which causes the output voltage to transition, is determined in part, by the pair of transistors of the input stage.

More particularly, the input stage further includes a third transistor of the same type as the pair of transistors and disposed in the first current path for receiving a bias voltage. The threshold voltage is a function of the bias voltage and characteristics of the first, second, and third transistors. Also provided in the input stage is a current mirror having an input transistor in series with the first current path and an output transistor in series with the second current path, with the input and output transistors of the current mirror having interconnected gate terminals.

With this arrangement, the threshold voltage of the inverter circuit is unaffected by process and temperature variations between NMOS and PMOS FETs which affect the threshold voltage of conventional inverters, rendering the threshold voltage of conventional inverters susceptible to as much as a ±25% variation. In this way, a more stable threshold voltage is achieved than heretofore provided in inverter circuits.

In one embodiment, the FETs of the input stage have substantially equal ratios of effective gate width to gate length, resulting in the threshold voltage of the inverter being equal to one-half of the bias voltage. This arrangement is advantageous since the inverter threshold voltage is a function of only the bias voltage, thereby eliminating any dependence on process and temperature variations. Alternatively, if the first, second, and third transistors of the input stage are not the same size, then the inverter threshold voltage is a function of the bias voltage as well as the threshold voltage of the input stage transistors. For example, if the input stage FETs are NMOS FETs, then the threshold voltage is a function of the bias voltage $V_B$ and the NMOS threshold voltage $V_{T_N}$. This arrangement also provides a threshold voltage stability advantage as compared to conventional inverters. This is because the threshold voltage of conventional inverters is a function of the $KP_P$, $KP_N$, $V_{T_P}$ and $V_{T_N}$.

A power reduction circuit is described for preventing current from flowing in the first current path when the input voltage is at a steady state $V_{DD}$ or ground level. To this end, the power reduction circuit includes a transistor coupled in series with the first current path of the input stage.

A disable circuit is provided for disabling the inverter when it is not in use. The disable circuit includes a first transistor coupled to the interconnected gate terminals of the current mirror transistors for preventing current from flowing through the current mirror and a second transistor coupled in parallel with a transistor of the output stage for defining the logic level of the output terminal.

The disable circuit reduces both static and dynamic power dissipation when the inverter is not in use. More particularly, the first transistor of the disable circuit disables the current mirror itself. The second transistor of the disable circuit pulls the output voltage to a defined logic level. With this arrangement, dynamic power dissipation associated with output signal logic state transitions, as well as static power dissipation associated with a logic high or low level input signal voltage are eliminated during periods of non-use of the inverter.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION OF THE INVENTION

Figure 2:
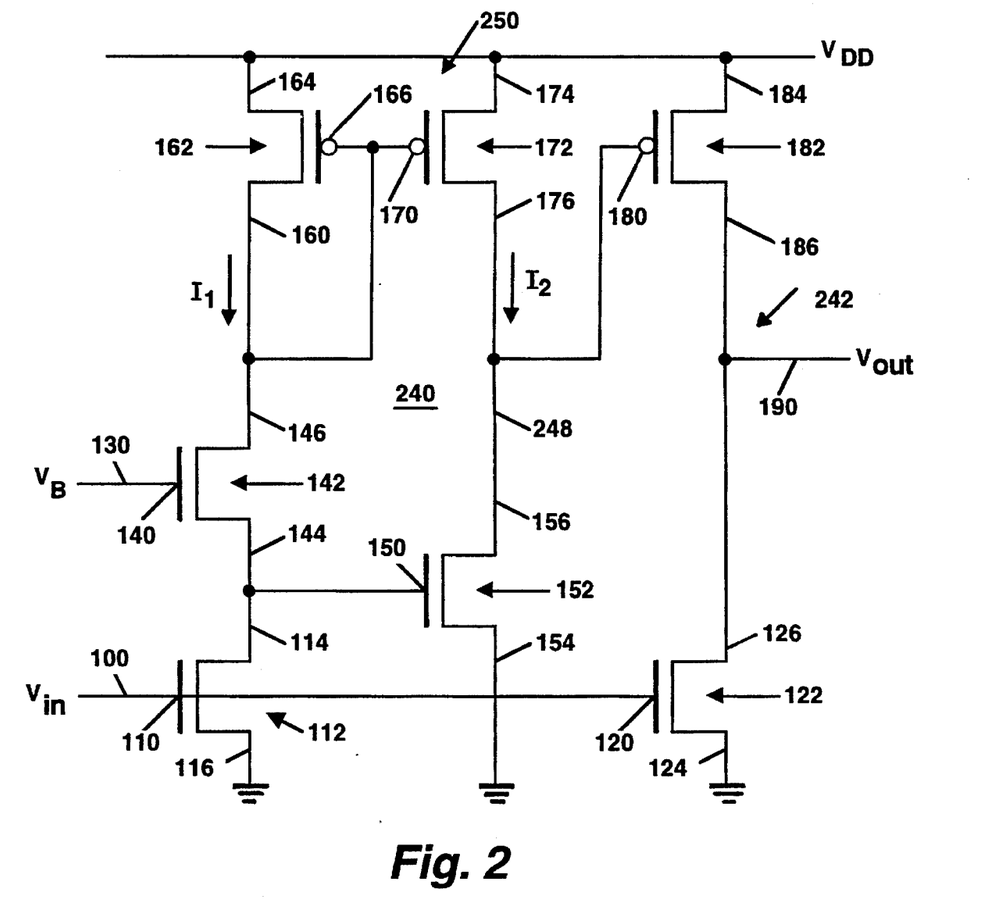
FIG. 2 is a schematic diagram of an illustrative embodiment of the inverter of the invention using NMOS input stage transistors.

Structure:

One embodiment of the inverter of the invention is depicted in FIG. 2. Input signal voltage, $V_{in}$, is applied to inverter input terminal 100 which is connected to gate terminal 110 and gate terminal 120 of NMOS FET 112 and NMOS FET 122, respectively. A bias voltage, $V_B$, is applied to bias terminal 130 which is connected to gate terminal 140 of NMOS FET 142. The threshold voltage, corresponding to the input signal voltage $V_{in}$ which causes a transition in the logic state of the inverter output signal $V_{out}$, is determined in part by the bias voltage $V_B$, as will be described. Source terminal 144 of FET 142 is connected to drain terminal 114 of FET 112 and to gate terminal 150 of NMOS FET 152. Source terminals 116 of FET 112, 154 of FET 152, and 124 of FET 122 are each connected to ground.

Drain terminal 146 of FET 142 is connected to drain terminal 160 of PMOS FET 162, the source terminal 164 of which is connected to $V_{DD}$, and to gate terminal 166 of FET 162. Gate terminal 166 of FET 162 is also connected to gate terminal 170 of PMOS FET 172, the source terminal 174 of which is connected to $V_{DD}$. The drain terminal 176 of FET 172 is connected to the drain terminal 156 of FET 152 and to gate terminal 180 of PMOS FET 182. The source terminal 184 of FET 182 is connected to $V_{DD}$. Drain terminal 186 of FET 182 is connected to drain terminal 126 of NMOS FET 122 and to inverter output terminal 190.

The inverter of FIG. 2 has an input stage 240 and an output stage 242. The input stage 240 includes NMOS FETs 112, 142, and 152, as well as a current mirror 250. The current mirror 250 includes PMOS FETs 162, 172 having interconnected gate terminals 166, 170, respectively. The input stage 240 includes a first current path through which a first current $I_1$ flows and a second current path through which a second current $I_2$ flows. The output stage 242 of the inverter includes PMOS FET 182 and NMOS FET 122, such output stage FETs having interconnected drain terminals 186, 126, respectively, with the interconnection therebetween providing the inverter output terminal 190.

Operation:

Referring to FIG. 2, the gate to source voltage of FET 112 is equal to the input voltage, $V_{in}$, applied to its gate terminal 110. Since the PMOS FETs 162, 172 of the current mirror 250 have interconnected gate terminals 166, 170, respectively, the first current $I_1$ through the first current path is proportional to the current $I_2$ through the second current path. When the currents $I_1$, $I_2$ are equal, the gate to source voltage of FET 112 equals the gate to source voltage of FET 152, provided FETs 112 and 152 have the same gate characteristics and are in saturation. Thus, under such conditions, the relationship between the gate to source voltage of FETs 112 and 152 can be expressed as follows:

$$V_{GS(112)} = V_{GS(152)} = V_{in} \tag{2}$$

The bias voltage $V_B$ applied to the gate terminal 140 of FET 142 is equal to the gate to source voltage of FET 142 plus the gate to source voltage of FET 152, as follows:

$$V_B = V_{GS(142)} + V_{GS(152)} \tag{3}$$

Substituting the input signal voltage $V_{in}$ for the gate to source voltage of FET 152 from equation (2) into the expression for the bias voltage $V_B$ in equation (3), the bias voltage $V_B$ can be expressed as follows:

$$V_B = V_{GS(142)} + V_{in} \tag{4}$$

Since the same current $I_1$ flows through series coupled FETs 142 and 112 and provided that FETs 142 and 112 have the same gate characteristics and are in saturation, the gate to source voltages of such FETs 142, 112 are equal. Likewise, the gate to source voltages of FETs 112, 142 are further equal to the input signal voltage $V_{in}$, based on equation (2) above. Thus, substituting $V_{in}$ for the gate to source voltage of FET 142 in equation (4), the threshold voltage $V_B$ can be expressed as follows:

$$V_B = 2V_{in} \tag{5}$$

In view of the above, it is apparent that when the first current $I_1$ through the first current path is equal to the second current $I_2$ through the second current path, the threshold voltage of the inverter of FIG. 2 is equal to one-half of the bias voltage $V_B$.

In order to illustrate the inverter circuit operation, consider the case where the input voltage $V_{in}$ is equal to one-half of the bias voltage $V_B$. By operation of the current mirror 250, the current through FET 172 is equal to the current through FET 162 and thus, is also equal to the current through the FET 152. Since both FETs 152 and 172 in the second current path support the current $I_2$, the node 248 at the interconnected drain terminals 156, 176 of FETs 152, 172, respectively, is at a constant voltage. More particularly, the voltage at node 248 and the gate terminal 180 of FET 182 is sufficient for FET 182 to conduct. Likewise, since the input voltage $V_{in}$ is equal to one-half of the bias voltage $V_B$, FET 122 conducts. Thus, it is apparent that under this operating condition, the output voltage $V_{out}$ is susceptible to a logic state transition.

Consider next the case where the input voltage $V_{in}$ is not equal to one-half of the bias voltage. Specifically, consider first where the input voltage $V_{in}$ is less than $V_B/2$. In this case, consideration of equation (3) reveals that the gate to source voltage of FET 152 is greater than one-half of the bias voltage $V_B$. This is because the gate to source voltage of FET 142 is equal to the input voltage $V_{in}$. Thus, since input voltage $V_{in}$ is less than $V_B/2$, the gate to source voltage of FET 152 must be greater than $V_B/2$ in order to satisfy equation (3). Moreover, since the gate to source voltage of FET 152 is greater than $V_B/2$, the current supported by FET 152 is greater than the current supported by series connected FET 172, thereby causing the voltage of the interconnection node 248 to drop. As the voltage at node 248 falls, the current supported by output FET 182 increases. The current supported by output FET 122 on the other hand is a function of the input voltage $V_{in}$ which, in this case, is less than one-half of the bias voltage $V_B$. Thus, under this operating condition, the output voltage $V_{out}$ increases since the current supported by FET 182 increases with respect to the current supported by FET 122.

Consider next the operating condition when the input voltage $V_{in}$ is greater than one-half of the bias voltage $V_B$. Again, consideration of equation (3) and the fact that the gate to source voltage of FET 142 is equal to the input voltage $V_{in}$ reveals that the gate to source voltage of FET 152 must be less than one-half of the bias voltage $V_B$ in order to satisfy equation (3). As the gate to source voltage of FET 152 decreases, so too does the current supported by FET 152. This arrangement causes the voltage at interconnection node 248 to increase, thereby decreasing the amount of current supported by output FET 182. Output FET 122 on the other hand supports a greater amount of current than FET 182 since its gate terminal 120 has the input voltage $V_{in}$ applied thereto, hence the output voltage $V_{out}$ drops.

From the above discussion, it should now be apparent that when the currents $I_1$ and $I_2$ are equal, the inverter threshold voltage, corresponding to the input signal voltage at which the output signal transitions, is a function of the bias voltage $V_B$. More generally however, the threshold voltage is given as follows:

$$V_{threshold} = \frac{V_B - V_{T_N} + \sqrt{\frac{\left(\frac{W}{L}\right)_{112}}{\left(\frac{W}{L}\right)_{152}}} V_{T_N}}{1 + \sqrt{\frac{\left(\frac{W}{L}\right)_{112}}{\left(\frac{W}{L}\right)_{152}}}} \quad (6)$$

In the derivation of equation (6), the gate characteristics of NMOS FETs 112 and 142 are assumed equal and the transistors are in saturation so that the following equation holds:

$$I = \frac{KP}{2} \frac{W}{L} (V_{gs} - V_T)^2 \quad (7)$$

Consideration of equation (6) reveals that, in addition to the bias voltage $V_B$, the threshold voltage is a function of $V_{T_N}$ of NMOS FETS 112 and 152. As illustrated above, when the gate characteristics of FETs 112 and 152 are equal, the threshold voltage is equal to one-half of the bias voltage $V_B$. Since, in this case the threshold voltage equals $V_B/2$ and is not a function of characteristics of any PMOS or NMOS FETs, the stability of the threshold voltage is enhanced, as compared to a conventional inverter shown in FIG. 1. More particularly, consideration of equation (1) reveals that the threshold voltage of a conventional inverter is additionally a function of the threshold voltages $V_{T_P}$ and $V_{T_N}$, as well as a function of the transconductances $KP_P$, $KP_N$ of the PMOS and NMOS transistors. In the present inverter, the transconductances of the NMOS FETs 112, 152 cancel, thereby eliminating the dependence of the inverter threshold voltage on process variations of the transconductance.

When NMOS FETs 112, 152 have different sizes (i.e., the ratio of the effective gate width to gate length of FET 152 is not equal to the same ratio for FET 112), the threshold voltage is a function of the bias voltage $V_B$ as well as the threshold voltage $V_{T_N}$ of the NMOS devices. This arrangement, also provides enhanced threshold voltage stability as compared to conventional inverters in which the threshold voltage is additionally a function of a PMOS threshold voltage $V_{T_P}$ and transconductances $KP_N$ and $KP_P$.

In some applications, it may be desirable to derive the bias voltage $V_B$ from the supply voltage $V_{DD}$ in order to avoid the necessity of providing an additional voltage source. For example, the bias voltage $V_B$ can be made equal to $V_{DD}$ effectively providing $V_{threshold} = V_{DD}/2$ or can be derived directly from the supply voltage with the use of a suitable resistor divider to provide a desired bias voltage.

Figure 3:
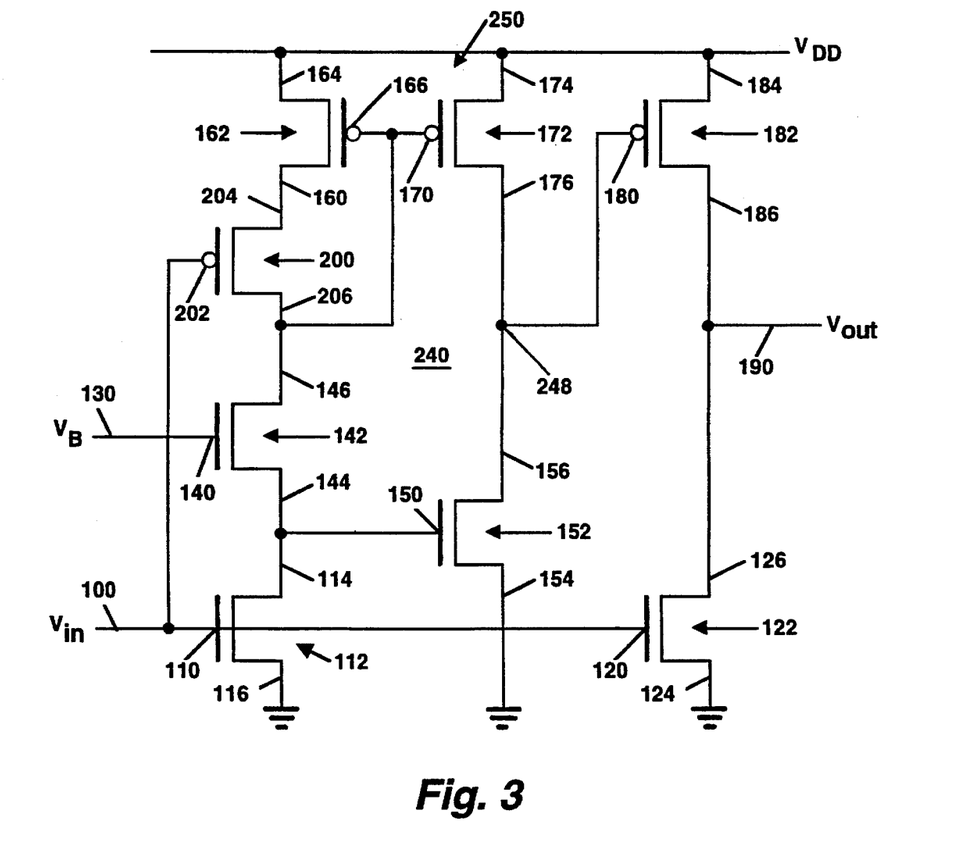
FIG. 3 is a schematic diagram of another embodiment of the inverter of the invention including a power reduction circuit which achieves zero static power when $V_{in}$ is either at ground or $V_{DD}$.

Structure:

Another embodiment of the invention which is similar to the embodiment depicted in FIG. 2, is shown in FIG. 3. In this embodiment, an additional PMOS FET 200, having a gate terminal 202 connected to input signal terminal 100, is connected in series between FET 162 and FET 142. Source terminal 204 of FET 200 is connected to drain terminal 160 of FET 162. Drain terminal 206 of FET 200 is connected to drain terminal 146 of FET 142, to gate terminal 166 of FET 162, and to gate terminal 170 of FET 172.

Operation:

The use of FET 200 in the embodiment of FIG. 3 provides a static power reduction feature whereby the first and second currents $I_1$, $I_2$, through the first and second current paths of the input stage 240 are equal to zero when the input signal voltage $V_{in}$ is in either a logic low state (i.e., at ground) or in a logic high state (i.e., at $V_{DD}$). More particularly, when the input voltage $V_{in}$ is at ground, FET 112 is off, thereby preventing current $I_1$ from flowing in the first, or input current path of the input stage 240. When the input voltage $V_{in}$ is in a logic high state, or at $V_{DD}$, FET 200 is off, thereby preventing current $I_1$ from flowing in the input current path.

This arrangement is advantageous because it eliminates undesirable static power dissipation. That is, by preventing current flow through the input stage 240 when the input voltage $V_{in}$ is in a steady state condition, at either a logic high or a logic low level, power dissipation in the inverter is minimized. Moreover, the reduced static power dissipation benefit provided by the additional PMOS FET 200 is achieved without sacrificing circuit performance. This is because, when the input voltage $V_{in}$ is either at a logic high level or a logic low level, not only is the current flow through the input stage 240 terminated, but also, the circuit node 248 and the output terminal 190 are in defined logic states.

More particularly, consider the operating condition when the input voltage $V_{in}$ is at a logic low level, or ground. As noted above, this condition causes FET 112 to turn off. Likewise, FET 122 is off. Since FETs 200 and 142 conduct, the gate terminal 150 of FET 152 will be pulled up, thereby causing FET 152 to turn on. Conduction of FET 152 causes the voltage at the interconnect node 248 to fall, thereby turning on FET 182. Since FET 182 is on and FET 122 is off, the output voltage $V_{out}$ will be pulled up to $V_{DD}$. Thus, it is apparent that when the input voltage $V_{in}$ is at a logic low level, the output voltage $V_{out}$ is at a logic high level and current is prevented from flowing in the circuit, thereby advantageously reducing the static power dissipation while maintaining the output terminal 190 and other circuit nodes in a defined logic state.

Consider next the case when the input voltage $V_{in}$ is at a logic high level. In this case, FETs 112 and 122 are on, whereas the PMOS FET 200 is off. With FET 112 on, the gate terminal 150 of FET 152 is pulled to ground, thereby turning off FET 152 and enabling the voltage at the interconnection node 248 to rise via FET 172. A high voltage at interconnect node 248 causes FET 182 to turn off. Since FET 122 is on, the output voltage $V_{out}$ is pulled to ground. Thus, in this operating condition too, the circuit nodes are in a defined logic state, providing stable inversion functionality with the benefit of reduced static power dissipation.

Figure 4:
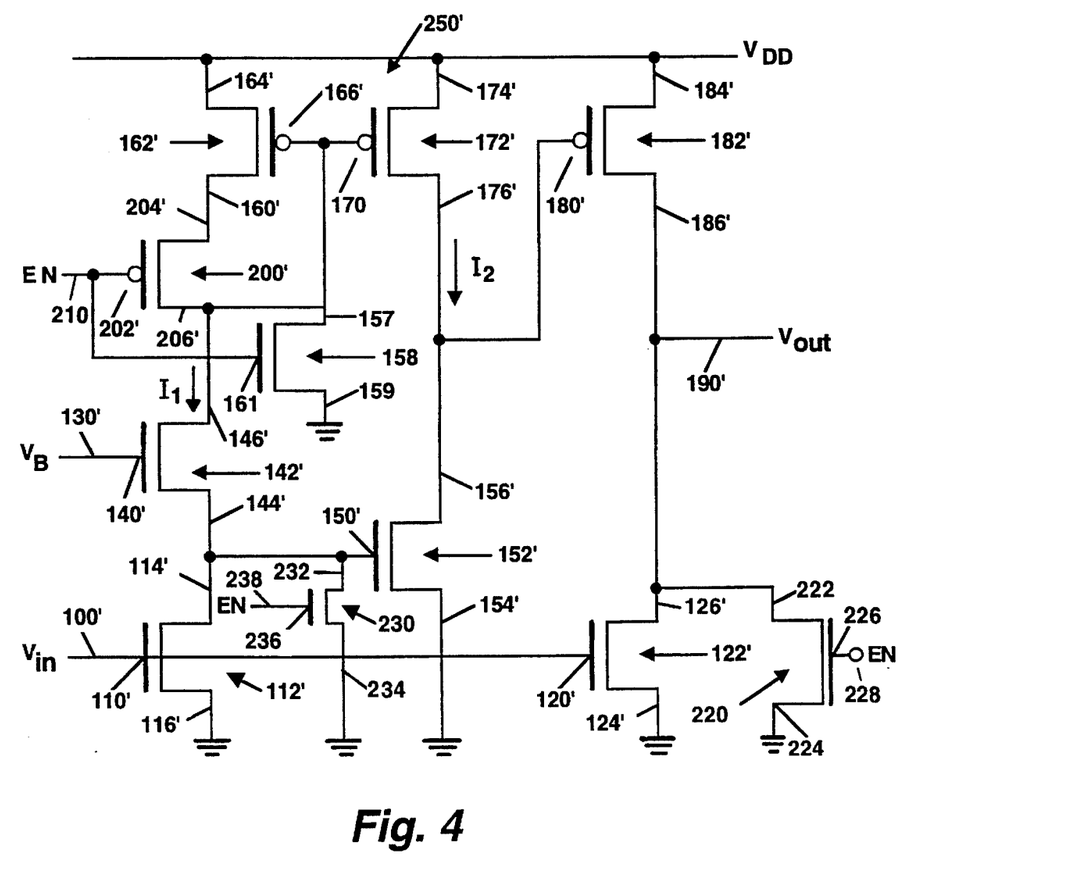
FIG. 4 is a schematic diagram of yet another embodiment of the inverter of the invention which includes an enable/disable feature.

Structure:

Yet another embodiment of the inverter of the invention is depicted in FIG. 4. As discussed with respect to the previous embodiments, input signal voltage $V_{in}$ is applied to inverter input terminal 100' which is connected both to gate terminal 110' and gate terminal 120' of FETs 112' and 122', respectively. Again a bias voltage $V_B$ is applied to bias terminal 130' which is connected to gate terminal 140' of FET 142'. Source terminal 144' of FET 142' is connected to drain terminal 114' of FET 112' and to gate terminal 150' of FET 152'. Source terminals 116' of FET 112', 154' of FET 152' and 124' of FET 122' are connected to ground. An NMOS FET 230 has a drain terminal 232 connected to the gate terminal 150' of FET 152' and a source terminal 234 connected to ground. A gate terminal 236 of FET 230 is coupled to an enable/disable signal input terminal 238.

Drain terminal 146' of FET 142' is connected to drain terminal 206' of FET 200'. Source terminal 204' of FET 200' is connected to drain terminal 160' of FET 162'. The gate terminal 202' of FET 200' is connected to an enable input terminal 210. Source terminal 164' of FET 162' is connected to $V_{DD}$. Drain terminal 206' of FET 200' is connected to drain terminal 146' of FET 142'. Source terminal 174' of FET 172' is connected to $V_{DD}$. Gate terminal 166' of FET 162' is connected to gate terminal 170' of FET 172' and to drain terminal 157 of an NMOS FET 158, the source terminal 159 of which is connected to ground. The gate terminal 161 of FET 158 is connected to the enable input terminal 210. The drain terminal 176' of FET 172' is connected to the drain terminal 156' of FET 152' and to gate terminal 180' of FET 182'. The source terminal 184' of FET 182' is connected to $V_{DD}$. Drain terminal 186' of FET 182' is connected to drain terminal 126' of FET 122' and to inverter output terminal 190'.

The drain terminal 126' of FET 122' is connected to the drain terminal 222 of an NMOS FET 220. The source terminal 224 of FET 220 is connected to ground and the gate terminal 226 of the FET 220 is connected to an enable input terminal 228, which may be further coupled to the enable input terminal 210.

Operation:

Additional NMOS FETs 158, 220, and 230 in the embodiment of FIG. 4 provide a disable feature to the inverter. In some applications, the inversion functionality of the circuit is utilized only at specified times. In such applications, it may be advantageous to disable the entire inverter circuit when its functionality is not utilized, in order to eliminate dynamic power dissipation associated with transitions of the inverter output signal $V_{out}$, as well as static power dissipation associated with the input signal being in a steady state logic high or logic low level.

To this end, the gate terminals 161, 226, 236 of FETs 158, 220, 230, respectively, are connected to enable input terminals 210, 228, 238, respectively. Preferably, the enable input terminals 210, 228, 238 are interconnected so that only a single enable/disable signal may be supplied to disable the inverter.

When the signal applied to terminals 210, 228, 238 is at a logic high level, the inverter is disabled. More particularly, a logic high enable signal turns off PMOS FET 200', whereas NMOS FETS 158, 220, 230 are on. In this condition, the output voltage signal $V_{out}$ is pulled to ground through FET 220. The gate terminal 150' of FET 152' is pulled to ground via FET 230. Since PMOS FET 200' is off, there is no current through the input current path of the current mirror 250' (i.e., through FET 162'). For this reason, and further because NMOS FET 152' is off, there is no current $I_2$ through PMOS FET 172'. Since the gate terminal 170' of PMOS FET 172' is pulled to ground via FET 158, the drain terminal 176' of such FET will approach $V_{DD}$. THUS, the gate terminal 180' of PMOS output FET 182' is pulled up to $V_{DD}$ causing FET 182' to turn off.

In view of the above discussion, it is apparent that when the enable signal applied to enable signal terminals 110, 228, and 238 is in a logic high state, the inverter circuit is disabled with the output terminal 190' pulled to ground and with all circuit nodes in a defined (i.e., rather than a floating) logic state. It is noteworthy that this is true regardless of the input voltage applied to the input terminal 100' and also regardless of whether the bias voltage $V_B$ continues to be applied to bias terminal 130' or not.

When the enable signal is at a logic low level the inverter is enabled. In this operating condition, FETs 158, 220, and 230 are off and thus, do not affect the operation of the circuit discussed above in conjunction with FIG. 2. With a logic low enable signal, PMOS FET 200' is on and does not affect the inverter operation.

Figure 5:
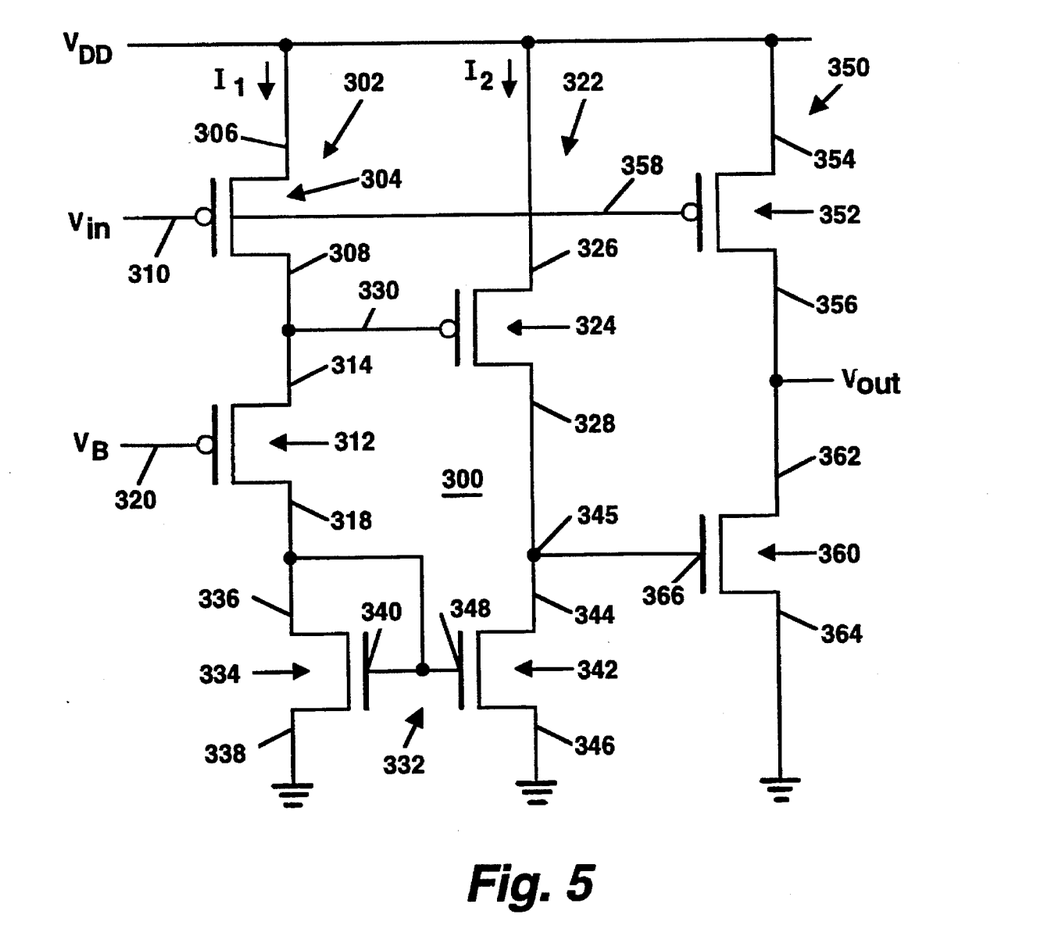
FIG. 5 is a schematic diagram of another illustrative embodiment of the inverter of the invention using PMOS input stage transistors.

Structure:

In the further embodiment of the inverter shown in FIG. 5, the stage 300 includes a pair of PMOS FETs 304, 324, a first one 304 being disposed in a first, or input current path 302 of the inverter input stage 300 and a second one 324 being disposed in the second, or output current path 322. A third PMOS transistor 312 of the input stage is disposed in the input current path 302, as shown. Input stage 300 further includes a current mirror 332 comprising an NMOS FET 334 disposed in the input current path 302 and an NMOS FET 342 disposed in the output current path 322. The embodiment of FIG. 5 further includes an output stage 350 in which series coupled PMOS FET 352 and NMOS FET 360 are disposed, as shown.

More particularly, PMOS FET 304 has a source terminal 306 connected to the supply voltage $V_{DD}$ and a drain terminal 308. The gate terminal 310 of FET 304 receives an input signal voltage $V_{in}$. The drain terminal 308 of FET 304 is connected to the gate terminal 330 of FET 324 and to the source terminal 314 of FET 312, as shown. The gate terminal 320 of FET 312 receives a bias voltage $V_B$ and the drain terminal 318 of FET 312 is connected to the current mirror 332. Also connected to the current mirror 332 is the drain terminal 328 of FET 324. Specifically, the drain terminal 318 of FET 312 is connected to the drain terminal 336 of FET 334, the source terminal 338 of which is connected to ground. The drain and gate terminals 336, 340 of FET 334 are interconnected and are further connected to the gate terminal 348 of FET 342. The source terminal 346 of FET 342 is connected to ground as shown. The drain terminal 344 of FET 342 is connected to the drain terminal 328 of FET 324, as well as to the gate terminal 366 of output NMOS FET 360. The source terminal 326 of FET 324 is connected to the supply voltage $V_{DD}$, as shown.

The output PMOS FET 352 has a gate terminal 358 connected to the gate terminal 310 of FET 304. The source terminal 354 of FET 352 is connected to the supply voltage $V_{DD}$. The drain terminal 356 of PMOS FET 352 is connected to the drain terminal 362 of NMOS FET 360 to provide an output terminal at which output voltage $V_{out}$ is provided. The source terminal 364 of FET 360 is connected to ground as shown.

Operation:

When the currents $I_1$ and $I_2$ through the input and output current paths 302, 322, respectively, of the input stage 300 are equal, the source to gate voltage of FET 324 is equal to the source to gate voltage of FET 304, provided that FETs 324 and 304 have the same gate characteristics and are in saturation as follows:

$$V_{SG(304)} = V_{SG(324)} \quad (8)$$

The bias voltage $V_B$ applied to the gate terminal 320 of FET 312 is equal to the supply voltage $V_{DD}$ minus the source to gate voltages of FETs 312 and 324 as follows:

$$V_{DD} = V_{SG(324)} + V_{SG(312)} + V_B \quad (9)$$

The input voltage $V_{in}$ applied to the gate terminal 310 of FET 304 is equal to the supply voltage $V_{DD}$ minus the source to gate voltage of FET 304, providing the following relationship:

$$V_{DD} = V_{SG(304)} + V_{in} \quad (10)$$

Since the source to gate voltage of FET 324 is equal to the source to gate voltage of FET 304 as revealed in equation (8), equation (9) can be rewritten as follows:

$$V_{DD} = V_{SG(304)} + V_{SG(312)} + V_B \quad (11)$$

The same current $I_1$ flows through FETs 304 and 312, the source to gate voltages of FETs 304 and 312 are equal, provided FETs 304 and 312 have the same gate characteristics and are in saturation. Substituting the source to gate voltage of FET 304 for the source to gate voltage of FET 312 in equation (11) provides the following relationship:

$$V_{DD} = 2V_{SG(304)} + V_B \quad (12)$$

Furthermore, substituting the expression for the source to gate voltage of FET 304 provided by equation (10) into equation (12) provides the following relationship:

$$V_{DD} = 2(V_{DD} - V_{in}) + V_B \quad (13)$$

Solving equation (13) for $V_{in}$, it is revealed that the input voltage $V_{in}$ is equal to the sum of the source voltage $V_{DD}$ and the bias voltage $V_B$ divided by two as follows:

$$V_{in} = \frac{V_{DD} + V_B}{2} \quad (14)$$

Thus, it is apparent that when the currents $I_1$ and $I_2$ through the input and output current paths 302, 322, respectively, of the input stage 300 are equal, the threshold voltage of the inverter of FIG. 5 is equal to one half of the sum of the bias voltage $V_B$ and the supply voltage $V_{DD}$.

In operation, when the input voltage $V_{in}$ is equal to one-half of the sum of $V_{DD}$ and $V_B$, the node 345 at the interconnection of FETs 324 and 342 is at a constant voltage, since the same current $I_2$ is supported by FETs 324 and 342. More particularly, the voltage at node 345 and gate terminal 366 of FET 360 is sufficient for FET 360 to conduct. Likewise, the input voltage $V_{in}$ applied to the gate terminal 358 of FET 352 is sufficient for FET 352 to conduct, thereby rendering the output voltage $V_{out}$ susceptible to a logic state transition.

When the input voltage is less than one-half of the sum of the bias voltage $V_B$ and the supply voltage $V_{DD}$, FET 342 will support more current than FET 324, thereby decreasing the voltage at the circuit node 345. This arrangement causes output FET 352 to support more current than FET 360, resulting in the output voltage $V_{out}$ being pulled to a logic high level through FET 352.

When the input voltage is greater than one-half of the sum of the supply voltage $V_{DD}$ and the bias voltage $V_B$, FET 324 supports more current than FET 342, thereby pulling the node 345 and the gate terminal 366 of FET 360 high, so as to turn on the output FET 60 and pull the output voltage $V_{out}$ to ground.

As in the case of the inverter embodiment of FIG. 2 for example, the inverter of FIG. 5 has a threshold voltage that is independent of the transconductances of the FETs 304 and 324 of the input stage. Rather, the threshold voltage of the inverter of FIG. 5 is a function of only the bias voltage $V_B$ and the supply voltage $V_{DD}$ when FETs 304, 312, and 324 are the same size. If the PMOS FETs 304 and 324 have different sizes (i.e., if the ratio of the effective gate width to gate length of the FETs is unequal), then the threshold voltage is a function of the bias voltage $V_B$ and the supply voltage $V_{DD}$, as well as the threshold voltage $V_{T_p}$ of such PMOS devices. Thus, the embodiment of FIG. 5 has the same advantages as the embodiments described above and may be readily modified to include the power reduction feature of FIG. 3 and/or the enable/disable feature of FIG. 4.

Having shown the preferred embodiment, those skilled in the art will realize many variations are possible which will still be within the scope and spirit of the claimed invention. Therefore, it is the intention to limit the invention only as indicated by the scope of the claims.

What is claimed is:

1. An inverter circuit for inverting an input voltage to provide an output voltage having an opposite logic state with respect to said input voltage, said inverter circuit comprising:

an input stage comprising a pair of transistors, a first one of said pair of transistors being disposed in a first current path between a supply voltage and ground and the second one of said pair of transistors being disposed in a second current path between said supply voltage and ground, wherein said first transistor is adapted to receive said input voltage, said input stage further comprising a bias transistor disposed in said first current path for receiving a bias voltage, said pair of transistors and said bias transistor being of the same type, either NMOS and PMOS; and an output stage comprising a PMOS transistor and an NMOS transistor having interconnected drain terminals at which said output voltage is provided, wherein said output voltage logic state transitions when said input voltage is at a predetermined threshold voltage, said predetermined threshold voltage being independent of the mobility of the carrier, the permittivity of the oxide layer and the thickness of the oxide layer associated with said pair of transistors of said input stage.

2. The inverter circuit recited in claim 1 wherein each of said pair of transistors of said input stage and said bias transistor has a ratio of effective gate width to gate length associated therewith and wherein said ratios are substantially equal.

3. The inverter circuit recited in claim 1 wherein said predetermined threshold voltage is equal to one-half of the bias voltage.

4. The inverter circuit recited in claim 1 wherein said predetermined threshold voltage is equal to one-half of the sum of the bias voltage and the supply voltage.

5. The inverter circuit recited in claim 1 further comprising a current mirror having an input transistor in said first current path and an output transistor in said second current path, said input and output transistors of said current mirror having interconnected gate terminals.

6. The inverter circuit recited in claim 5 further comprising a power reduction transistor coupled in series with said input transistor of said current mirror and said bias transistor of said input stage for preventing current from flowing through said pair of transistors of said input stage when said input voltage is at a logic high level or a logic low level.

7. The inverter circuit recited in claim 5 wherein said pair of transistors and said bias transistor are PMOS devices, said first one of said pair of transistors having a drain terminal connected to a source terminal of said bias transistor and to a gate terminal of said second one of said pair of transistors and having a source terminal connected to said supply voltage, said bias transistor having a drain terminal connected to said input transistor of said current mirror, and said second one of said pair of transistors having a drain terminal connected to said output transistor of said current mirror and to said output stage and having a source terminal connected to said supply voltage.

8. The inverter circuit recited in claim 5 wherein said pair of transistors and said bias transistor are NMOS devices, said first one of said pair of transistors having a drain terminal connected to a source terminal of said bias transistor and to a gate terminal of said second one of said pair of transistors and having a source terminal connected to ground, said bias transistor having a drain terminal connected to said input transistor of said current mirror, and said second one of said pair of transistors having a drain terminal connected to said output transistor of said current mirror and to said output stage and having a source terminal connected to ground.

9. The inverter circuit recited in claim 5 further comprising a disable circuit for disabling said inverter circuit.

10. The inverter circuit recited in claim 9 wherein said disable circuit comprises a first transistor in parallel with either said NMOS transistor of said PMOS transistor of said output stage and a second transistor coupled to said interconnected gate terminals of said input and output transistors of said current mirror.

11. The inverter circuit recited in claim 1 wherein each of said pair of transistors of said input stage has a ratio of effective gate width to gate length associated therewith and wherein said ratios are not equal.

12. An inverter circuit for inverting an input voltage to provide an output voltage, said inverter circuit comprising:

a current mirror having a first current path through which a first current flows and a second current path through which a second current flows, said second current being proportional to said first current, wherein said first current path has a bias voltage terminal adapted to receive a bias voltage and an input voltage terminal adapted to receive said input voltage, and wherein said first and second currents are a function of said bias voltage;

an output stage comprising a first transistor having a gate terminal coupled to said second current path and a second transistor having a gate terminal receiving said input voltage, said first and second transistors being interconnected at said output terminal of said inverter; and a third transistor disposed in said first current path and having a gate terminal providing said bias voltage terminal and a fourth transistor disposed in said first current path and having a gate terminal providing said input voltage terminal, said third and fourth transistors coupled in series at an interconnection node, said inverter further comprising a fifth transistor disposed in said output current path of said current mirror, said fifth transistor having a gate terminal coupled to said interconnection node.

13. The inverter recited in claim 12 wherein said third, fourth, and fifth transistors are of the same type, either NMOS or PMOS.

14. The inverter circuit recited in claim 12 wherein said first transistor is a PMOS FET and said second transistor is an NMOS FET, and wherein said first and second transistors are interconnected at a drain terminal of said first transistor and a drain terminal of said second transistor.

15. An inverter for inverting an input voltage to an output voltage at an output terminal having an opposite logic state with respect to said input voltage, said inverter comprising:

a first transistor having a drain terminal, a gate terminal receiving an input voltage, and a source terminal;

a second transistor having a drain terminal, a gate terminal connected to said drain terminal of said first transistor and a source terminal;

a third transistor having a drain terminal, a gate terminal receiving a bias voltage, and a source terminal connected to said drain terminal of said first transistor;

a current mirror comprising:
an input transistor having a drain terminal connected to said drain terminal of said bias transistor, a gate terminal, and a source terminal; and
an output transistor having a drain terminal connected to said drain terminal of said second transistor, a gate terminal connected to said gate terminal of said input transistor, and a source terminal;

an output PMOS transistor having a drain terminal at which said output voltage is provided, a gate terminal, and a source terminal connected to a supply voltage; and an output NMOS transistor having a drain terminal connected to said drain terminal of said output PMOS transistor, a gate terminal, and a source terminal connected to ground.

16. The inverter recited in claim 15 wherein said source terminal of said input transistor of said current mirror and said source terminal of said output transistor of said current mirror are connected to ground and wherein said source terminal of said first transistor, and said source terminal of said second transistor are connected to said supply voltage and wherein said gate terminal of said NMOS output transistor is connected to said drain terminal of said second transistor and wherein said gate terminal of said PMOS output transistor is connected to said input voltage.

17. The inverter recited in claim 16 wherein said output voltage changes logic state when said input voltage is at a predetermined threshold voltage equal to one-half of the sum of the bias voltage and the supply voltage.

18. The inverter recited in claim 15 wherein said source terminal of said input transistor of said current mirror and said source terminal of said output transistor of said current mirror are connected to said supply voltage and wherein said source terminal of said first transistor and said source terminal of said NMOS output transistor are connected to ground and wherein said gate terminal of said PMOS output transistor is connected to said drain terminal of said second transistor and wherein said gate terminal of said NMOS output transistor is connected to said input voltage.

19. The inverter recited in claim 18 wherein said output voltage changes logic state when said input voltage is at a predetermined threshold voltage equal to one-half of said bias voltage.

20. An inverter circuit for inverting an input voltage to provide an output voltage having an opposite logic state with respect to said input voltage, said inverter circuit comprising:

- an input stage comprising a pair of transistors, a first one of said pair of transistors being disposed in a first current path between a supply voltage and ground and the second one of said pair of transistors being disposed in a second current path between said supply voltage and ground, wherein said first transistor is adapted to receive said input voltage, said input stage further comprising a bias transistor disposed in said first current path for receiving a bias voltage, said pair of transistors and said bias transistor being of the same type, either NMOS and PMOS;
- an output stage comprising a PMOS transistor and an NMOS transistor having interconnected drain terminals at which said output voltage is provided, wherein said output voltage logic state transitions when said input voltage is at a predetermined threshold voltage; and
- a current mirror having an input transistor in said first current path and an output transistor in said second current path, said input and output transistors of said current mirror having interconnected gate terminals.

* * * * *